(12) United States Patent
Casiez et al.

(10) Patent No.: US 12,040,595 B2
(45) Date of Patent: Jul. 16, 2024

(54) OPTOELECTRONIC DEVICE COMPRISING A SEMICONDUCTOR LAYER BASED ON GeSn HAVING A SINGLE-CRYSTAL PORTION WITH A DIRECT BAND STRUCTURE AND AN UNDERLYING BARRIER REGION

(71) Applicant: Commissariat à l'Energie Atomique et aux Energies Alternatives, Paris (FR)

(72) Inventors: Lara Casiez, Grenoble (FR); Vincent Reboud, Grenoble (FR); Pablo Acosta Alba, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 4 days.

(21) Appl. No.: 18/057,492

(22) Filed: Nov. 21, 2022

(65) Prior Publication Data

US 2023/0187567 A1    Jun. 15, 2023

(30) Foreign Application Priority Data

Nov. 23, 2021    (FR) ..................... 21 12376

(51) Int. Cl.
| | |
|---|---|
| *H01S 5/00* | (2006.01) |
| *H01S 5/20* | (2006.01) |
| *H01S 5/32* | (2006.01) |
| *H01S 5/323* | (2006.01) |

(Continued)

(52) U.S. Cl.
CPC .......... *H01S 5/2031* (2013.01); *H01S 5/2077* (2013.01); *H01S 5/321* (2013.01);
(Continued)

(58) Field of Classification Search
CPC ...... H01S 5/2031; H01S 5/2077; H01S 5/321; H01S 5/32358; H01S 5/3428; H01S 5/0424; H01S 5/3223; H01S 5/04257; H01S 5/12
See application file for complete search history.

(56) References Cited

U.S. PATENT DOCUMENTS 4,504,518 A  *  3/1985  Ovshinsky ........ H01L 21/02488
                                                136/258
10,699,902 B2    6/2020  Reboud et al.
(Continued)

FOREIGN PATENT DOCUMENTS

WO    WO 2018/037189 A1    3/2018

OTHER PUBLICATIONS

French Preliminary Search Report issued Jul. 7, 2022 in French Application 21 12376, filed on Nov. 23, 2021 (with English Translation of Categories of cited documents and Written Opinion), 11 pages.

(Continued)

*Primary Examiner* — Kinam Park
(74) *Attorney, Agent, or Firm* — Oblon, McClelland, Maier & Neustadt, L.L.P.

(57) ABSTRACT

An optoelectronic device including a crystalline semiconductor layer based on GeSn and including a pin junction. This formed semiconductor layer includes a base portion; a single-crystal intermediate portion having an average value $x_{pi1}$ of proportion of tin less than $x_{ps1}$, thus forming a barrier region against charge carriers flowing in an upper portion; and the single-crystal upper portion including a homogeneous medium with a proportion of tin $x_{ps1}$, and vertical structures having an average value $x_{ps2}$ of proportion of tin greater than $x_{ps1}$, thus forming regions for emitting or for receiving infrared radiation.

9 Claims, 6 Drawing Sheets

(51) Int. Cl.
    *H01S 5/34*         (2006.01)
    *H01L 31/0376*    (2006.01)
    *H01L 31/20*      (2006.01)

(52) U.S. Cl.
    CPC ........ *H01S 5/32358* (2013.01); *H01S 5/3428* (2013.01); *H01L 31/03765* (2013.01); *H01L 31/204* (2013.01)

(56) References Cited

U.S. PATENT DOCUMENTS

| | | | |
|---|---|---|---|
| 2008/0308143 A1* | 12/2008 | Atanackovic | H01L 31/1055 |
| | | | 136/255 |
| 2016/0240728 A1* | 8/2016 | Kalliakos | H01L 33/0062 |
| 2019/0244813 A1* | 8/2019 | Reboud | H01L 21/28238 |
| 2020/0227894 A1* | 7/2020 | Reboud | H01L 21/0245 |
| 2020/0343414 A1* | 10/2020 | Reboud | H01L 33/40 |

OTHER PUBLICATIONS

Wirths, S. et al. "Lasing in direct-bandgap GeSn alloy grown on Si" Nature Photonics, (2015) (5 pages).
Galluccio, E. et al. "Cell formation in stanogermanides using pulsed laser thermal anneal on Ge0.91Sn.0.09" Materials Science in Semiconductor Processing, (2020) (5 pages).
Reboud, V. et al. "Lasing in Group-IV materials" Silicon Photonics IV: Innovative Frontiers, (2021) (74 pages).
Chang, G. et al. "Design and Analysis of Tensile-Strained GeSn Mid-Infrared Photodetectors on Silicon" IEEE 16th International Conference on Group IV Photonics. (2019) (2 pages).

* cited by examiner

OPTOELECTRONIC DEVICE COMPRISING A SEMICONDUCTOR LAYER BASED ON GeSn HAVING A SINGLE-CRYSTAL PORTION WITH A DIRECT BAND STRUCTURE AND AN UNDERLYING BARRIER REGION

TECHNICAL FIELD

The field of the invention is that of optoelectronic devices for emitting or for receiving infrared radiation, and more particularly MWIR (for Middle Wave InfraRed) radiation, comprising a semiconductor layer based on germanium-tin GeSn within which a pin semiconductor junction is situated.

PRIOR ART

Optoelectronic devices emitting infrared radiation may comprise an optically-active semiconductor layer based on a crystalline compound from column IV of the periodic table of elements, for example a compound of germanium-tin GeSn. The semiconductor layer comprises a semiconductor junction, for example of the pin type, where the majority of the infrared radiation emitted by the optoelectronic device is generated. Germanium-tin $Ge_{1-x}Sn_x$ may indeed have a direct energy band structure conducive to the emission of infrared light radiation when the atomic proportion of tin x is sufficient.

The formation of such a semiconductor layer based on GeSn however remains tricky, owing notably to the large difference between the lattice parameter of germanium ($a_{Ge}$=5.658 Å) and that of tin ($a_{Sn}$=6.489 Å), and to the difference between the melting point of germanium (around 950° C.) and that of tin (around 240° C.) which may lead to a segregation of the tin.

In order to fabricate such an optoelectronic device, one approach consists in forming a partially relaxed semiconductor layer of GeSn by epitaxial growth, starting from a virtual-substrate of germanium. In this respect, the publication by Wirths et al. entitled "*Lasing in direct-bandgap GeSn alloy grown on Si*", Nature Photon. 9, 88-92 (2015) describes a method of fabricating an optoelectronic device in which a semiconductor layer of germanium-tin GeSn is formed by epitaxial growth of the CVD type starting from a quasi-relaxed nucleation layer of germanium Ge formed on a silicon substrate Si. A thick semiconductor layer of germanium-tin GeSn is formed by epitaxy starting from the nucleation layer, and has a thickness sufficient for the mechanical stresses to plastically relax and for the germanium-tin to be quasi-relaxed over at least one thickness of the semiconductor layer. Therefore, the semiconductor layer thus formed exhibits a relatively good crystalline quality, aside from at the interface with the nucleation layer where the plastic relaxation of the mechanical stresses has generated structural defects of the dislocations type. The authors show that an atomic proportion of tin of 12.6% allows the energy band structure in a relaxed semiconductor layer of GeSn to be rendered direct and thus infrared light radiation to be emitted. However, it may be necessary to obtain a semiconductor layer with a direct band structure with a smaller atomic proportion of tin.

Another approach then consists in forming a semiconductor layer based on GeSn subjected to tensile mechanical stresses in the main plane of the layer. Indeed, as seen notably in the publication by Wirths et al. entitled "*Strain Engineering for Direct Bandgap GeSn Alloys*", IEEE 11th International Conference On Group IV Photonics, 2014, the minimum atomic proportion $x_{min}$ of tin for the energy band structure of the semiconductor layer to be direct depends on the type of mechanical stresses to which the semiconductor layer is subjected (compressive or tensile) and on their intensity. Therefore, the decrease in this minimum atomic proportion $x_{min}$ of tin allows the risks of segregation of the tin to be reduced.

In this respect, the international application WO2018/037189A1 describes a method of fabricating an optoelectronic device for emitting infrared radiation in a semiconductor layer based on GeSn under tensile stress, the latter being obtained in the form of a membrane suspended above a substrate and strained under tension by tensor arms, then collapsed onto the substrate and assembled to the latter by direct bonding.

This optoelectronic device therefore comprises a semiconductor layer of GeSn, in which a pin semiconductor junction flush with the upper face is situated. Metal polarizing contacts lie on and in contact with a doped region of the n type and with a doped region of the p type. The intrinsic region is situated in a portion of the semiconductor layer exhibiting a tensile stress, and where the average atomic proportion of tin is sufficient for, in view of the value of the tensile stress, its energy band structure to be direct.

However, there exists a need to provide an optoelectronic device for emitting or for receiving infrared radiation, comprising a semiconductor layer of GeSn under tensile stress and having an atomic proportion of tin sufficient for its band structure to be direct, able to be fabricated without having to make use of the method of tensile stressing by implementing a suspended membrane followed by its collapse, nor of techniques for engineering the mechanical stress by formation of a stack of thin layers.

DESCRIPTION OF THE INVENTION

The aim of the invention is to overcome, at least in part, the drawbacks of the prior art and, more particularly, to provide an optoelectronic device for emitting or for receiving infrared radiation, comprising a semiconductor layer based on GeSn under tensile stress and having an atomic proportion of tin sufficient for its band structure to be direct, which offers good performance characteristics and which may be formed without having to make use of the aforementioned methods, in particular of the method described in the international application WO2018/037189A1.

For this purpose, the subject of the invention is an optoelectronic device for emitting or for receiving infrared radiation, comprising: a nucleation layer; a crystalline semiconductor layer of GeSn; and metal polarizing contacts, situated on and in contact with doped regions. The semiconductor layer extends in a main plane, has an upper face opposite to the nucleation layer, and comprises: a base portion, extending over and in contact with the nucleation layer; an upper portion, extending over the base portion, single-crystal, and under tensile stress with an average value $\varepsilon_{ps}$ in the main plane, formed of a homogeneous medium, having a uniform value $x_{ps1}$ of atomic proportion of tin, the average value $\varepsilon_{ps}$ of the tensile stresses and the value $x_{ps1}$ of the atomic proportion of tin being such that the upper portion has a direct bandgap structure; a pin semiconductor junction, comprising a doped region of the n type, and a doped region of the p type, flush with the upper face, and an intrinsic region, situated within the upper portion and extending between the doped regions.

According to the invention, the single-crystal upper portion comprises, aside from the homogeneous medium, vertical structures extending within the homogeneous medium along an axis orthogonal to the main plane over the whole the thickness of the upper portion, and having an average value $x_{ps2}$ of atomic proportion of tin greater than $x_{ps1}$, thus forming regions for emitting or for receiving infrared radiation.

In addition, the semiconductor layer furthermore comprises an intermediate portion, situated between and in contact with the base portion and the upper portion along an axis orthogonal to the main plane, single-crystal, and comprising a region extending in the main plane over its whole width and having an average value $x_{pi1}$ of atomic proportion of tin less than $x_{ps1}$, thus forming a barrier region against charge carriers flowing in the upper portion.

Certain preferred, but non-limiting, aspects of this optoelectronic device are the following.

The base portion may have an average value $x_{pb}$ greater than the average value $x_{pi1}$ of the atomic proportion of tin in the intermediate portion and less than the average value $x_{ps2}$ of the atomic proportion of tin in the vertical structures.

The average value $x_{pb}$ of the atomic proportion of tin in the base portion may be in the range between 4% and 10%.

The base portion may extend up to a surface of the upper face and surround the intermediate portion and the upper portion in the main plane, at least one of the doped regions being situated within the base portion.

The intermediate portion may entirely cover the base portion, the doped regions being situated within the upper portion.

The semiconductor layer may be formed, starting from the nucleation layer, of a lower region and an upper single-crystal region, the upper portion being situated within the upper region.

The nucleation layer may be composed of germanium, and may lie on a carrier substrate preferably made of silicon.

The optoelectronic device may be a laser diode or a light-emitting diode designed to generate infrared radiation, or a photodiode designed to detect infrared radiation.

The optoelectronic device may form a laser diode, and may comprise a waveguide, referred to as lower waveguide, formed within the nucleation layer of germanium, a waveguide said to be active, coupled to the lower waveguide, comprising the gain medium and formed within the semiconductor layer, and at least one Bragg reflector situated within the lower waveguide or within the active waveguide.

The invention also relates to a method of fabricating an optoelectronic device according to any one of the preceding features, comprising the following steps: formation of the semiconductor layer having a uniform initial value of the atomic proportion of tin, equal to the average value $x_{pb}$ of the base portion, by epitaxy starting from the nucleation layer; formation of the doped regions within the semiconductor layer, spaced one from the other by the intrinsic region; formation of the intermediate portion and of the upper portion, by annealing with a nanosecond laser, by applying a laser pulse onto at least one surface of the upper face where the intrinsic region is flush, having a wavelength, an energy density and a duration predefined in such a manner as to make a part of the compound of the semiconductor layer melt entirely over a predefined depth of the latter, preferably equal to at least 150 nm.

The step for annealing by nanosecond laser may be carried out by illuminating with the laser pulse only the surface of the upper face where the intrinsic region is flush.

The step for annealing by nanosecond laser may be carried out by illuminating with the laser pulse the upper face of the semiconductor layer where the pin semiconductor junction is situated.

The fabrication method may comprise, prior to the step for annealing by nanosecond laser, a step for amorphization of at least the intrinsic region by ion implantation of non-dopant chemical elements of the n or p type, over a depth equal to at least the depth of the doped regions.

Only the intrinsic region may be amorphized during the amorphization step, before the step for annealing by nanosecond laser.

The step for forming the doped regions may be carried out in such a manner as to amorphize the doped regions.

BRIEF DESCRIPTION OF THE DRAWINGS

Other aspects, aims, advantages and features of the invention will become more clearly apparent upon reading the following detailed description of preferred embodiments of the latter, given by way of non-limiting example and with reference to the appended drawings, in which.

DETAILED DESCRIPTION OF PARTICULAR EMBODIMENTS

Figure 1A:
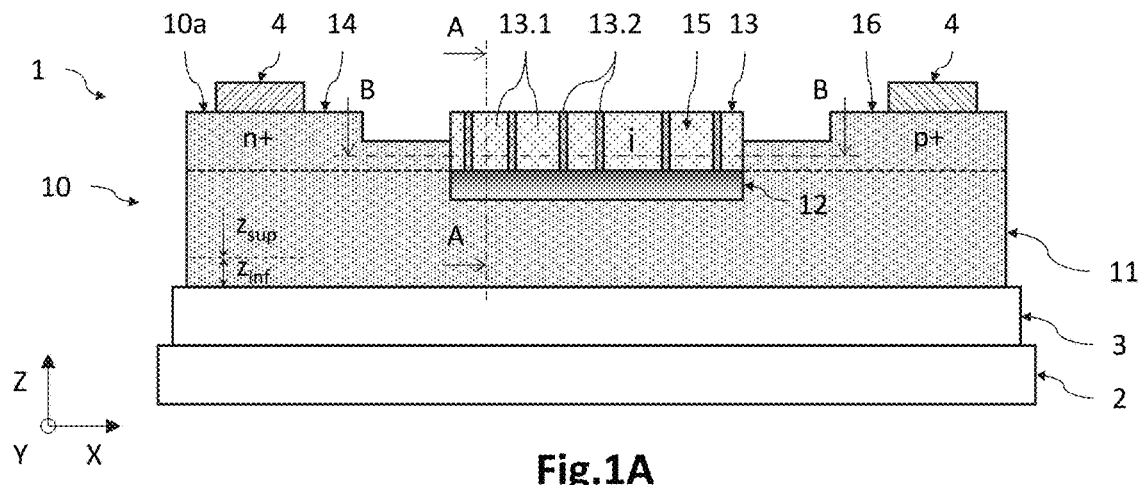
FIG. 1A is a schematic and partial view, as a transverse cross-section, of an optoelectronic device according to one embodiment.

In the figures and in the following part of the description, the same references represent identical or similar elements. In addition, the various elements are not shown to scale for the sake of the clarity of the figures. Furthermore, the various embodiments and variants are not exclusive of one another and may be combined together. Unless otherwise stated, the terms "substantially", "around", "of the order of" mean to within 10%, and preferably to within 5%. Furthermore, the terms "in the range between . . . and . . . " and equivalents mean that the limits are included, unless otherwise stated.

The invention relates to an optoelectronic device for emitting or for receiving infrared radiation, for example a laser diode, a light-emitting diode, or a photodiode. The infrared radiation emitted or received is situated in the infrared spectral range, and more precisely in the spectral range of the mid-infrared (central wavelength λ preferably included in the range between around 2 μm and 6 μm).

The optoelectronic device comprises a semiconductor layer based on germanium-tin GeSn which comprises several regions or portions which differ from one another notably by the atomic proportion of tin. It comprises, in particular, an upper portion under tensile stress and where the atomic proportion of tin x is sufficient, and in view of the tensile stresses, for its energy band structure to be direct.

"Semiconductor layer based on germanium-tin GeSn" is understood to mean a layer composed of a semiconductor compound comprising at least germanium Ge and tin Sn. The semiconductor compound based on GeSn may be a binary compound $Ge_{1-x}Sn_x$, a tertiary compound, for example $Si_yGe_{1-x-y}Sn_x$, or even a quaternary or more. The local or average atomic proportion of tin contained in the semiconductor compound is denoted x.

"Stressed portion" is understood to mean a portion of the semiconductor layer exhibiting a tensile or compressive mechanical stress, leading to a deformation of the bonds of its crystal lattice. The portion is under tensile stress when it is subjected to a mechanical stress which tends to stretch the lattice bonds in a plane. In the framework of the invention, the upper portion of the semiconductor layer is under tensile stress in the main plane of the layer; this corresponds to the fact that its lattice parameter has an effective value higher than its natural value when the semiconductor compound is relaxed (i.e. not stressed). In the following part of the description, the stress in question is oriented in the main plane of the semiconductor layer.

The compound based on GeSn of the semiconductor layer has an indirect energy band structure in the absence of sufficient tensile stresses and/or of a sufficient atomic proportion of tin. The tensile stresses to which the upper portion is subjected and its atomic proportion of tin are sufficient for its energy band structure to be direct. Generally speaking, GeSn has a direct energy band structure when the energy minimum of the valley L (or indirect valley) is higher than or equal to the energy minimum of the valley Γ (or direct valley) of the conduction band, in other words: $\Delta E = E_{min,L} - E_{min,\Gamma} \geq 0$. "Equal" here is understood to mean that this energy difference ΔE is of the order of magnitude or smaller than kT, where k is the Boltzman's constant and T the temperature of the material. As have shown the aforementioned Wirths et al. 2014, the minimum atomic proportion of tin $x_{min}$ to make the energy band structure direct decreases as the tensile mechanical stresses to which the semiconductor layer is subjected increase.

In the framework of the invention, the semiconductor layer based on germanium-tin GeSn comprises a base portion, an intermediate portion and an upper portion, where the latter two are arranged vertically one above the other along the thickness axis of the semiconductor layer. The upper portion has a direct energy band structure. Moreover, it is single crystal and is composed of a homogeneous medium within which vertical structures extend forming quantum wells (regions emitting or receiving infrared radiation). Furthermore, the intermediate portion, situated under the upper portion, forms a barrier region for the charge carriers flowing in the upper portion.

FIG. 1A is a partial and schematic view, as a transverse cross-section, of an optoelectronic device 1 according to one embodiment. The optoelectronic device 1 here is designed to emit coherent light radiation (laser diode), and may be of the DFB (Distributed Feedback) type or of the DBR (Distributed Bragg Reflector) type.

A three-dimensional orthogonal reference frame XYZ is defined here and for the following part of the description, where the axes X and Y form a plane parallel to the main plane of a carrier substrate 2 on which the semiconductor layer 10 lies, and where the axis Z is oriented in the thickness of the layers. In the following part of the description, the terms "vertical" and "vertically" are understood as relating to an orientation substantially parallel to the axis Z. Furthermore, the terms "lower" and "upper" are understood as relating to a positioning which increases when moving away from the carrier substrate 2 in the direction +Z.

The optoelectronic device 1 comprises a semiconductor layer 10 based on GeSn grown epitaxially starting from a nucleation layer 3, which lies on a carrier substrate 2. The semiconductor layer 10 has an upper face 10a opposite to the nucleation layer 3 and where at least one doped region 14 of the n type and a doped region 16 of the p type of a pin semiconductor junction is flush.

The optoelectronic device 1 here comprises a carrier substrate 2, made of an electrically-conducting or dielectric material. This carrier substrate 2 may have a thickness of the order of a few tens of nanometres to a few hundreds of microns, for example a thickness in the range between 10 μm and 750 μm. Here, it is made of silicon, but may more generally be made of sapphire, borosilicate, silica, glass, quartz, amongst other materials.

The optoelectronic device 1 comprises a nucleation layer 3 formed on the carrier substrate 2. As a variant, the carrier substrate 2 and the nucleation layer 3 may be regions of the same substrate or of the same layer. The nucleation layer 3 is formed from a crystalline material adapted to the nucleation (germination) of the semiconductor layer 10 based on GeSn. The material is single-crystal at least on the upper face (opposite to the carrier substrate 2) of the nucleation layer 3. It may be chosen from amongst the elements or compounds of column IV of the periodic table, and may be germanium, as is the case here, or silicon, tin, or the compounds such as GeSn, SiGeSn, SiGe. It may also be chosen from amongst the compounds of columns III and IV, such as GaP, AlP, AlAs, InP, etc., or else may be chosen from amongst the compounds of columns II and VI, such as ZnS, CdTe, etc. In this example, the nucleation layer 3 is a layer of germanium having a thickness greater than the critical thickness starting from which the mechanical stresses to which the layer is subjected plastically relax.

The optoelectronic device 1 comprises a semiconductor layer 10 based on GeSn, formed by epitaxy starting from the nucleation layer 3. It is formed from a crystalline semiconductor compound based on GeSn, in other words from the binary compound GeSn, as is the case here, or as a variant from its tertiary compounds (SiGeSn, etc.) or even quaternary, for example.

The semiconductor layer 10 has a thickness greater than the critical thickness starting from which the mechanical stresses to which the layer is subjected plastically relax. Thus, the thickness of the semiconductor layer 10 may be equal to at least 300 nm, and be for example in the range between 300 nm and 2 μm. By way of example, here it is equal to 480 nm.

Also, the semiconductor layer 10 is single crystal over a large part of its thickness, in particular in the place where the pin semiconductor junction is notably situated. In other words, it has a lower region $z_{inf}$ extending along the axis Z starting from the nucleation layer 3 of germanium, and where structural defects of the dislocations type may be present; then an upper region $z_{sup}$ which does not substantially comprise structural defects and hence is single crystal. This upper region $z_{sup}$ extends from the lower region $z_{inf}$ up to the upper face 10a of the semiconductor layer 10. The pin semiconductor junction is situated within this single-crystal upper region $z_{sup}$.

The semiconductor compound $Ge_{1-x}Sn_x$ has an atomic proportion of tin x which is not homogeneous everywhere in the semiconductor layer 10. Thus, it may be homogeneous in certain regions or portions of the semiconductor layer 10, for example in the base portion 11, and vary vertically (along the thickness axis Z) and/or horizontally (in the plane XY) in certain regions or portions of the semiconductor layer 10, for example in the intermediate 12 and upper 13 portions.

Moreover, the semiconductor layer 10 exhibits mechanical stresses oriented in the plane XY which are also not uniform everywhere. Thus, it may exhibit compressive mechanical stresses in certain regions or portions, and it exhibits tensile stresses in other regions or portions, in particular in the upper portion 13. The local or average value of the mechanical stresses it is subjected in the plane XY is denoted ε, of positive sign (compressive stresses) or negative sign (tensile stresses).

The semiconductor layer 10 comprises in particular several portions which differ by their average atomic proportion of tin and/or by the average mechanical stresses to which they are subjected. "Average proportion" or "average stress" here is understood to mean the average value within the whole of the medium in question. Thus, the semiconductor layer 10 comprises a base portion 11 which extends over and in contact with the nucleation layer 3; an intermediate portion 12 which extends over and in contact with the base portion 11; and an upper portion 13 which extends over and in contact with the intermediate portion 12. "Extends over" is understood to mean the portion is situated on top of the underlying portion along the axis Z.

In this embodiment, the base portion 11 extends from the nucleation layer 3 up to the upper face 10a of the semiconductor layer 10, and hence surrounds the intermediate portion 12 and the upper portion 13 in the plane XY. As a variant, as described in detail with reference to FIG. 4A, the base portion 11 may only extend over a part of the thickness of the semiconductor layer 10 and hence be covered by the intermediate portion 12 and the upper portion 13.

The semiconductor layer 10 comprises, first of all, a base portion 11 which extends over and in contact with the nucleation layer 3. The base portion 11 extends in the lower region (where it may comprise structural defects) and hence beginning from the nucleation layer 3 and here into the upper region where it is therefore single-crystal. The base portion 11 has a substantially uniform atomic proportion of tin, equal to an average value $x_{pb}$. The average atomic proportion of tin $x_{pb}$ may be in the range between 4% and 20%, and preferably between 4% and 10% (hence with a base portion 11 having an indirect gap), and here is equal to around 8%. It may exhibit non-zero mechanical stresses, for example compressive stresses in the lower region $z_{inf}$, or be relaxed or quasi-relaxed in particular in the upper region $z_{sup}$. It may also be subjected to compressive stresses within the whole of its volume (i.e. in the lower $z_{inf}$ and upper $z_{sup}$ regions).

The semiconductor layer 10 subsequently comprises the intermediate portion 12, which extends between (along the axis Z) and in contact with the base portion 11 and the upper portion 13. In this example, it does not extend over the whole width of the semiconductor layer 10, and is therefore surrounded by the base portion 11 in the plane XY. In this example, the upper portion has a thickness equal to around 75 nm.

The intermediate portion 12 is situated within the upper region $z_{sup}$ and is therefore single-crystal. Furthermore, it has an atomic proportion of tin $x_{pi}$ which varies along the axis Z and here remains substantially constant in the plane XY. The atomic proportion of tin $x_{pi}$ in particular exhibits a minimum value $x_{pi1}$ lower than a value $x_{ps1}$ of a homogeneous medium 13.1 (described hereinbelow) of the upper portion 13. In this example, it varies between the minimum value $x_{pi1}$ and a maximum value $x_{pi2}$ higher than $x_{pi1}$. By way of example, in the case where the average atomic proportion of tin $x_{pb}$ is equal to around 8%, the minimum value $x_{pi1}$ is equal to around 2%, and the maximum value $x_{pi2}$ is equal to around 10%.

Lastly, the semiconductor layer 10 comprises the upper portion 13, which extends over and in contact with the intermediate portion 12. More precisely, it lies entirely on the intermediate portion 12. In this example, it does not extend over the whole width of the semiconductor layer 10, and is therefore surrounded by the base portion 11 in the plane XY. In this example, the upper portion has a thickness equal to around 135 nm.

The upper portion 13 is situated within the upper region $z_{sup}$, and is therefore single-crystal. Furthermore, it has an atomic proportion of tin $x_{ps}$ which varies in the plane XY. More precisely, the upper portion 13 is composed of a homogeneous medium 13.1 whose atomic proportion of tin is uniform and equal to an average value $x_{ps1}$ higher than the minimum value $x_{pi1}$ of the intermediate portion 12; and of vertical structures 13.2 whose average atomic proportion of tin $x_{ps2}$ is higher than the value $x_{ps1}$ of the homogeneous medium 13.1. In this example, the atomic proportion of tin $x_{ps1}$ in the homogeneous medium is equal to around 7%, and the atomic proportion of tin $x_{ps2}$ in the vertical structures is equal to around 16%, much higher than the average value $x_{pb}$ of the base portion. It should be pointed out that the upper portion 13 is single-crystal despite the presence of the vertical structures 13.2.

The vertical structures 13.2 extend over the whole thickness of the upper portion 13, along an axis substantially parallel to the axis Z. They accordingly have a height along the axis Z substantially equal to the thickness of the upper portion 13. They may have a columnar shape in the sense that the two transverse dimensions in the plane XY are of the same order, or may have a wall shape in the sense that one of the transverse dimensions in the plane XY (length) is greater, for example at least 5 or 10 times greater, than the other of the transverse dimensions (width), as FIG. 2B illustrates. This wall shape of the vertical structures 13.2 allows the laser threshold to be lowered with respect to columns, given that the charge carriers have more chance of recombining within the quantum wells. Furthermore, the transverse dimensions in the plane XY may be constant or otherwise along the whole of or part of their height.

Furthermore, the upper portion 13 exhibits tensile mechanical stresses in the plane XY with an average value of $\varepsilon_{ps}$. By way of example, the mechanical stresses $\varepsilon_{ps}$ here are equal to −0.4% around. The average value $\varepsilon_{ps}$ of the tensile stresses of the upper portion 13 and the average value $x_{ps1}$ of the atomic proportion of tin of the homogeneous medium 13.1 correspond to the fact that the energy band structure is direct in the vertical structures 13.2, and here in the entire upper portion 13 (hence within the homogeneous medium 13.1). It should be noted here that the tensile stressing of the upper portion 13 may be due to the presence of the vertical structures 13.2 in the homogeneous medium 13.1, and/or may be due to the fact that the atomic proportion of tin in the homogeneous medium 13.1 is less than that in the base portion 11, or again may even be due to the tin-enriched region and with a proportion $x_{pi2}$ in the intermediate portion 12.

The semiconductor layer 10 comprises a pin semiconductor junction situated within the upper region $z_{sup}$ and, more precisely, a doped region 14 of the n type and a doped region 16 of the p type which are flush with the upper face 10a, between which an intrinsic region 15 (not intentionally doped by dopant elements) extends. The level of doping of the doped regions 14, 16 may for example be in the range between $5 \times 10^{18}$ cm$^{-3}$ and $1 \times 10^{20}$ cm$^{-3}$, and here can be equal to around $3 \times 10^{19}$ cm$^{-3}$. In this example, the n+ doped region 14 and the p+ doped region 16 are situated within the base portion 11, on either side of the upper portion 13. The intrinsic region 15 is situated within the upper portion 13, in other words within the homogeneous medium 13.1 and in the vertical structures 13.2.

Finally, the optoelectronic device 1 comprises metal contacts 4 which lie on the upper face 10a of the semiconductor layer 10, one in contact with the n+ doped region 14 and the other in contact with the p+ doped region 16. They provide the electrical polarization of the pin semiconductor junction.

In operation, the optoelectronic device 1 is forward biased by the metal contacts 4. The charge carriers are introduced into the n+ doped region 14 and into the p+ doped region 16, reach the intrinsic region 15, pass through the homogeneous medium 13.1 and recombine within the vertical structures 13.2. Indeed, it turns out that the vertical structures 13.2 whose atomic proportion of tin is $x_{ps2}$ (here, e.g. 16%) surrounded by the homogeneous medium 13.1 at $x_{ps1}$ (here equal to around 7%), less than $x_{ps2}$, form quantum wells surrounded by a potential barrier in an upper portion 13 where the band structure is direct. Moreover, the rate of radiative recombination in the intrinsic region 15 is improved by the fact that the intermediate portion 12, with its atomic proportion of tin at $x_{pi1}$ (here equal to around 2%) less than $x_{ps1}$ (here equal to around 7%), forms a barrier region for the charge carriers flowing in the intrinsic region 15. Furthermore, the performance characteristics of the optoelectronic device 1 are improved by the fact that the intrinsic region 15 with its vertical structures 13.2 is situated within a single-crystal upper portion 13 with a tensile deformation.

Figure 1B:
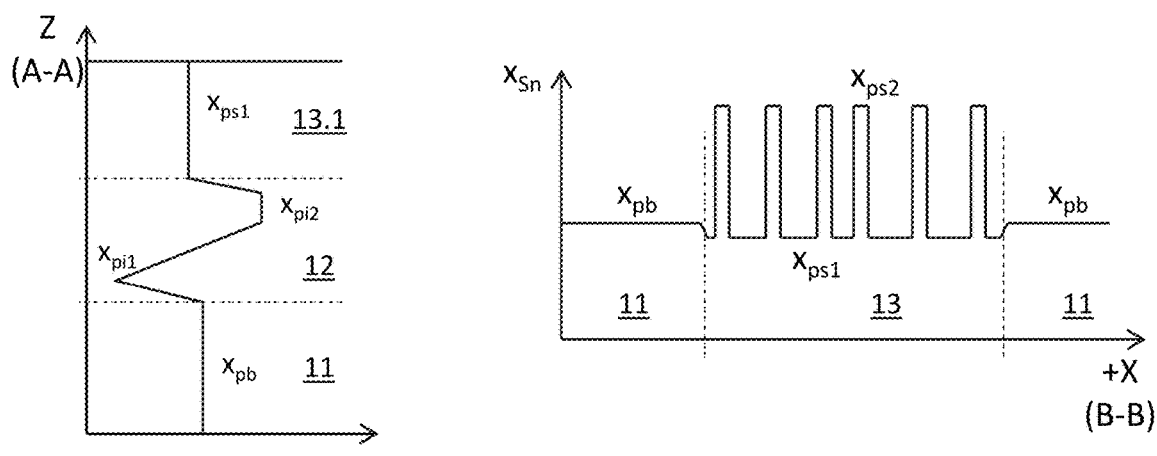
FIG. 1B illustrates examples of variation of the atomic proportion of tin in the optoelectronic device in FIG. 1A, along the cross-section line A-A (left-hand graph) and along the cross-section line B-B (right-hand graph)
Figure 1C:
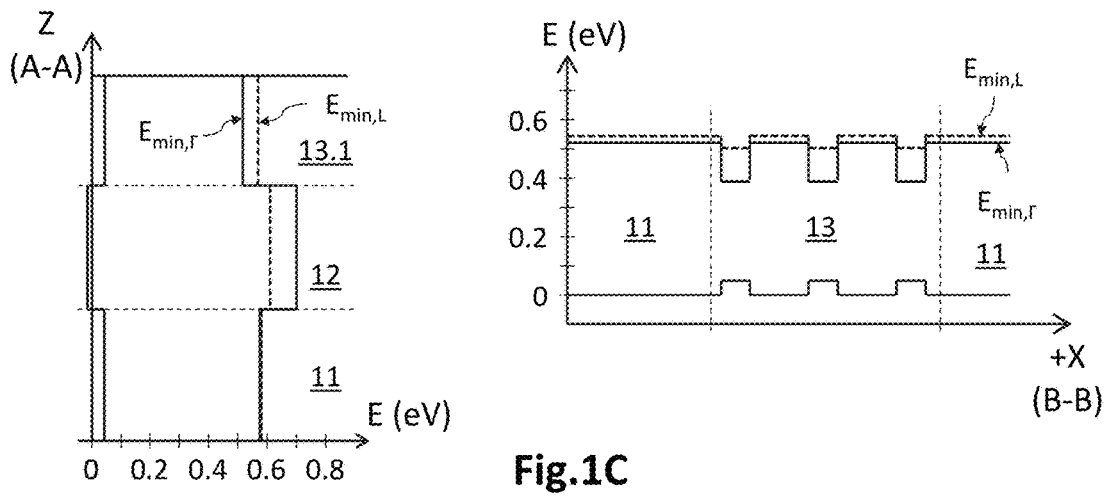
FIG. 1C illustrates examples of energy band structure in the optoelectronic device in FIG. 1A, along the cross-section line A-A (left-hand graph) and along the cross-section line B-B (right-hand graph)

FIG. 1B illustrates one example of variations of the atomic proportion of tin in the semiconductor layer 10, and FIG. 1C illustrates one example of energy band structures within the semiconductor layer 10, along the cross-section lines A-A (left-hand graphs) and B-B (right-hand graphs) shown in FIG. 1A.

Considering first of all the cross-section line B-B (right-hand graphs in FIGS. 1B and 1C), the atomic proportion of tin goes from the average value $x_{pb}$ in the base portion 11, here equal to around 8%, to the value $x_{ps1}$ in the homogeneous medium 13.1 of the upper portion 13, here equal to around 7%, and to the value $x_{ps2}$ higher than $x_{ps1}$ in the vertical structures 13.2, here equal to around 16%.

Furthermore, the average value $\varepsilon_{ps}$ of the tensile stresses in the upper portion 13, for example here equal to around −0.4%, associated with the value $x_{ps1}$ of the atomic proportion of tin in the homogeneous medium 13.1, lead to the energy band structure being direct. Thus, the minimum energy $E_{min,L}$ of the conduction band of the valley L (dashed line) is higher than the minimum energy $E_{min,\Gamma}$ of the conduction band of the valley Γ (continuous line). Moreover, the vertical structures 13.2 with an atomic proportion of tin $x_{px2}$ surrounded by the homogeneous medium 13.1 with an atomic proportion of tin $x_{ps1}$, lower than $x_{ps2}$, lead to the associated energy band structure forming quantum wells surrounded by a potential barrier. Accordingly, the vertical structures 13.2 are regions of radiative recombination of the charge carriers injected by the metal contacts, thus generating infrared radiation.

The cross-section line A-A (left-hand graphs in FIGS. 1B and 1C) is now considered. In the base portion 11, the atomic proportion of tin has a value equal to $x_{pb}$, here equal to around 8%, which remains substantially constant along the axis Z. In the intermediate portion 12, the atomic proportion of tin x falls from the value $x_{pb}$ down to a minimum value $x_{pi1}$, here equal to around 2%, then, in this example, climbs back up to a maximum value $x_{pi2}$, here equal to around 10%. Finally, the atomic proportion of tin decreases down to the value $x_{ps}$, here equal to around 7%, which remains substantially constant along the axis Z within the upper portion 13.

In the lower graph, for the sake of clarity, the band structure does not take into account the region of the intermediate portion 12 at 10% of tin. The fact that the intermediate portion 12 has an atomic proportion of tin $x_{pi1}$ less than $x_{ps}$ (here $x_{pi1}$=2% less than $x_{ps}$=7%) corresponds to the fact that this region depleted in tin of the intermediate portion 12 forms a barrier region for the charge carriers flowing in the upper portion 13, and hence only flowing in the intrinsic region 15 of the pin semiconductor junction. This results in an improvement of the radiative recombination rate in the intrinsic region 15, and hence an improvement in the performance characteristics of the optoelectronic device 1.

Figure 2A:
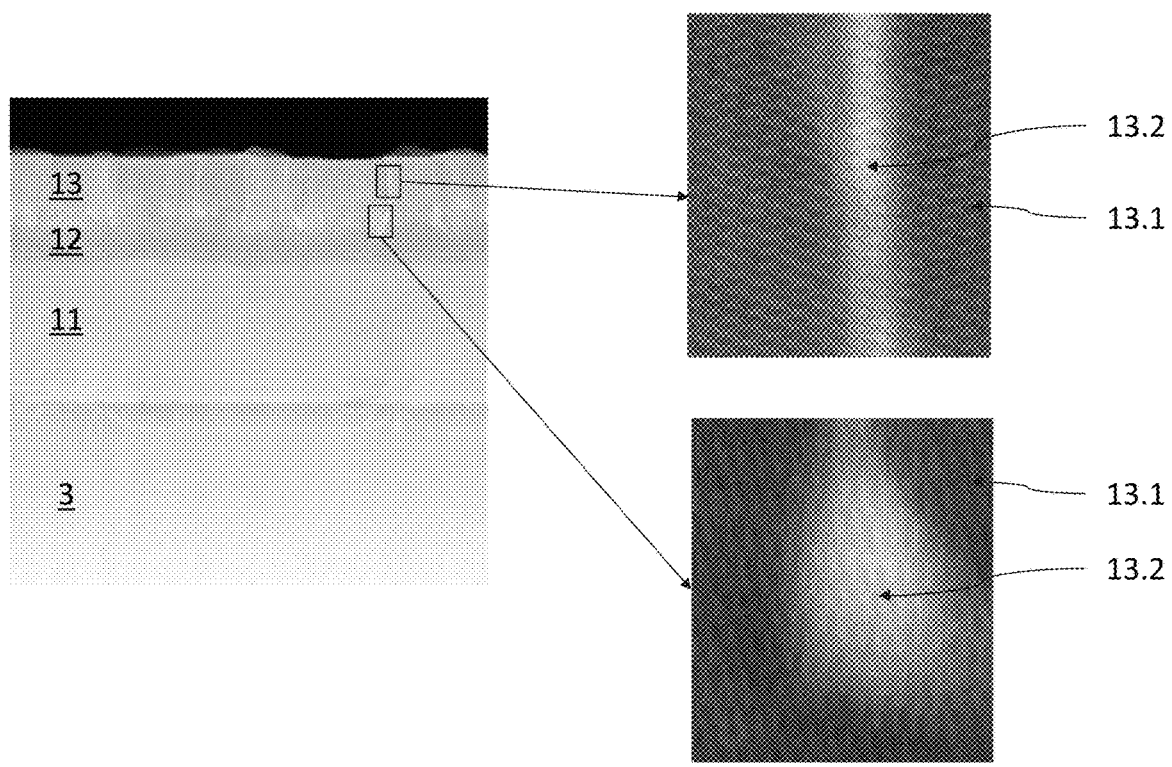
FIG. 2A illustrates cross-sectional views, obtained by scanning transmission electron microscope, of one example of a stack in the optoelectronic device in FIG. 1A, composed of the silicon carrier substrate, of the nucleation layer of germanium, and of the semiconductor layer of GeSn, highlighting the base portion, the intermediate portion, and the upper portion.
Figure 2B:
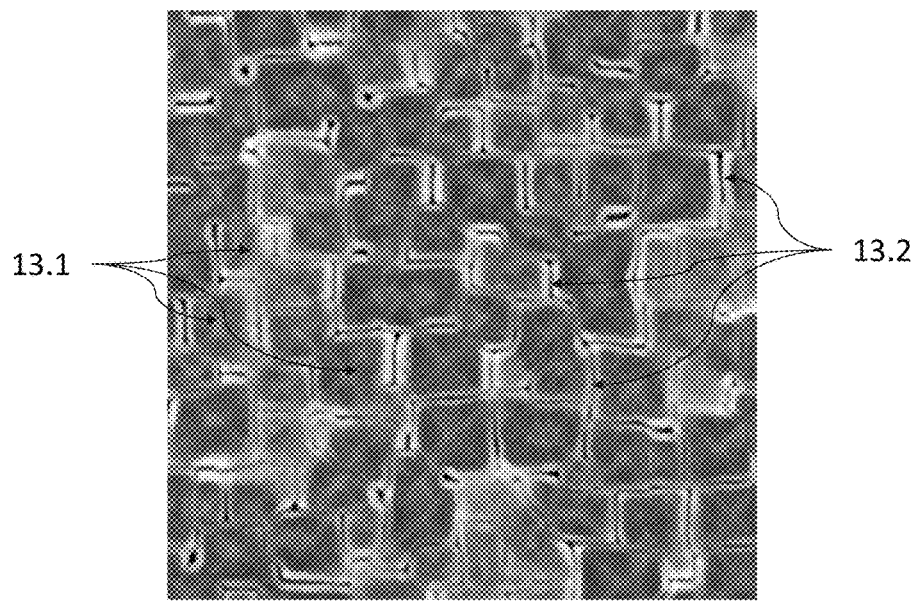
FIG. 2B illustrates a top view, obtained by electron microscope, of one example of the surface of the upper portion of the semiconductor layer of the optoelectronic device in FIG. 1A, highlighting the homogeneous medium and the vertical structures of the upper portion.

FIG. 2A illustrates cross-sectional views of one experimental example of a semiconductor layer 10 of GeSn lying on a nucleation layer 3 of germanium of an optoelectronic device 1.

Here, are more precisely shown: the nucleation layer 3 of germanium, then the base portion 11, the intermediate portion 12 and the upper portion 13 of the semiconductor layer 10 of GeSn, together with two localized views of a vertical structure 13.2, at its root and at its top. The views are generated by STEM (for Scanning Transmission Electron Microscopy).

In this example, the base portion 11 is composed of GeSn with a homogeneous atomic proportion of tin $x_{pb}$ of around 8%. The intermediate portion 12 has a proportion of tin $x_{pi}$ which goes from the value $x_{pb}$ of 8% down to a minimum value $x_{pi1}$ of around 2% to then climb back up to a maximum value $x_{pi2}$ of around 10%, and finally to fall back to the value $x_{ps1}$ of around 7%. The upper portion 13 is composed of the homogeneous medium 13.1, where the proportion of tin $x_{ps1}$ is homogeneous and equal to around 7%, and of vertical structures 13.2 where the proportion of tin $x_{ps2}$ is equal to around 16%.

FIG. 2B is a top view of one experimental example of an upper portion 13 composed of the homogeneous medium 13.1 and of the vertical structures 13.2. This view of the surface is generated by scanning electron microscope and shows the vertical structures 13.2 within the homogeneous medium 13.1.

It is apparent from FIGS. 2A and 2B that the vertical structures 13.2 here have a root having transverse dimensions (in the plane XY) greater than in its upper part. In addition, the upper part here has transverse dimensions which remain substantially constant along the axis Z. Lastly, the vertical structures 13.2 here take the form of a wall, in the sense that they have, in the plane XY, a length greater than their width and extend in such a manner as to surround, at least in part, a region or cell of the homogeneous medium 13.1.

FIGS. 3A to 3G illustrate various steps of a method of fabricating the optoelectronic device 1 in FIG. 1A, according to one embodiment. In this example, the optoelectronic device 1 is a laser diode. The method implements a step for annealing by nanosecond laser to form the intermediate 12 and upper 13 portions, the laser pulse here being localized only on a part of the upper face 10a. As a variant, as indicated hereinbelow, it can illuminate the entire upper face 10a.

Figure 3A:
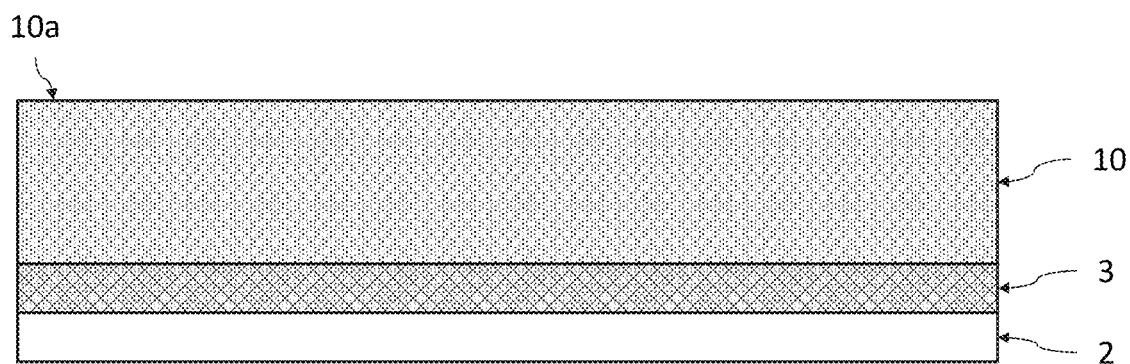
FIGS. 3A to 3H illustrate steps of a method of fabricating an optoelectronic device according to an embodiment similar to that in FIG. 1A.

With reference to FIG. 3A, a stack is formed composed of the carrier substrate 2, of the nucleation layer 3, and of the semiconductor layer 10 based on GeSn. The carrier substrate 2 here is a wafer made of silicon, and the nucleation layer 3 is grown by epitaxy with germanium starting from the carrier substrate 2. The nucleation layer 3 has a thickness greater than its critical thickness, such that it is single-crystal on its upper face.

Here, the semiconductor layer 10 is composed of $Ge_{1-x}Sn_x$ here with x uniform and equal to what will be the average atomic proportion of tin $x_{pb}$ in the base portion 11, here equal to around 8%. It may be formed by CVD (for Chemical Vapour Deposition) techniques, such as RPCVD (for Reduce Pressure Chemical Vapour Deposition), MOCVD (for Metal-Organic Chemical Vapour Deposition), PECVD (for Plasma-Enhanced Chemical Vapour Deposition), HVPE (for Hydride Vapour Phase Epitaxy), or even also by sputtering. Techniques such as MBE (for Molecular Beam Epitaxy) or LPE (for Liquid Phase Epitaxy) may also be used.

The semiconductor layer 10 is a thick layer, in the sense that its thickness is greater than its critical thickness for plastic relaxation of the mechanical stresses, such that it has the lower region $z_{inf}$ under compressive stress situated in contact with the nucleation layer 3 of germanium, and the upper region $z_{sup}$ which does not substantially comprise any structural defects. Here, the semiconductor layer 10 of GeSn has a thickness equal to around 480 nm. Furthermore, the atomic proportion of tin x in the semiconductor layer 10, here 8%, has a value equal to at least a minimum value $x_{min}$, which is predefined and depends on the value $x_{ps2}$ that it is desired to obtain in the vertical structures 13.2, in view of the tensile stress $\varepsilon_{ps}$ that will be generated in the upper portion 13. This lower value $x_{min}$ may be defined at a prior stage by means of experimental tests. Lastly, the semiconductor layer 10 here has a constant thickness and comprises two substantially plane faces, a lower face in contact with the nucleation layer 3, and the upper opposite face 10a.

Figure 3B:
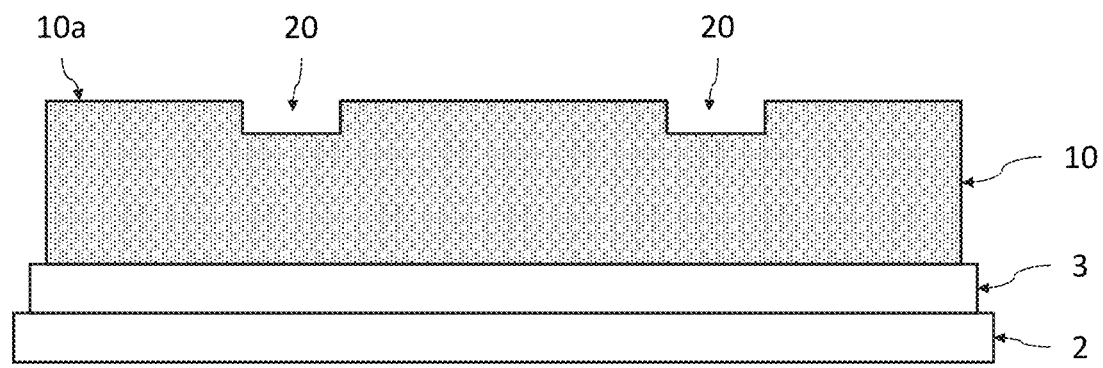

With reference to FIG. 3B, here a structuring in thickness of the nucleation layer 3 and of the semiconductor layer 10 is carried out by photolithography and etching operations. Here, the idea is to etch the nucleation layer 3 and the semiconductor layer 10, so as to form portions of layer, according to a shape in the plane XY which depends on the optical function of these portions of layer. Furthermore, at least one recess 20 may also be formed in the upper face in such a manner as to bound what will be the intrinsic region 15 of the pin junction. Furthermore, the Bragg reflector or reflectors (not shown) may be formed within the nucleation layer 3 of germanium or within the semiconductor layer 10 of GeSn.

Figure 3C:
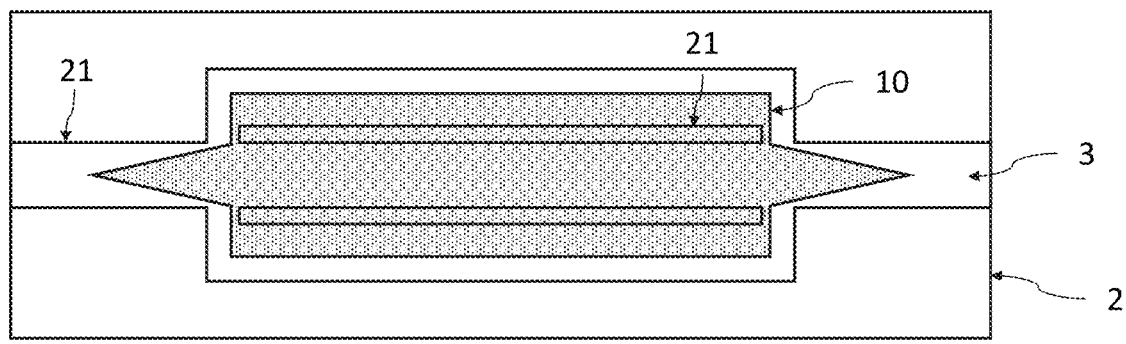

With reference to FIG. 3C, which is a top view of the stack in FIG. 3B, the carrier substrate 2 may comprise an integrated waveguide (not shown), and the nucleation layer 3 and the semiconductor layer 10 may form upper waveguides optically coupled to the integrated waveguide. More precisely, the waveguide of the semiconductor layer 10 is optically coupled to the integrated waveguide via the waveguide 21 of the nucleation layer 3. Other structuring configurations are of course possible.

Figure 3D:
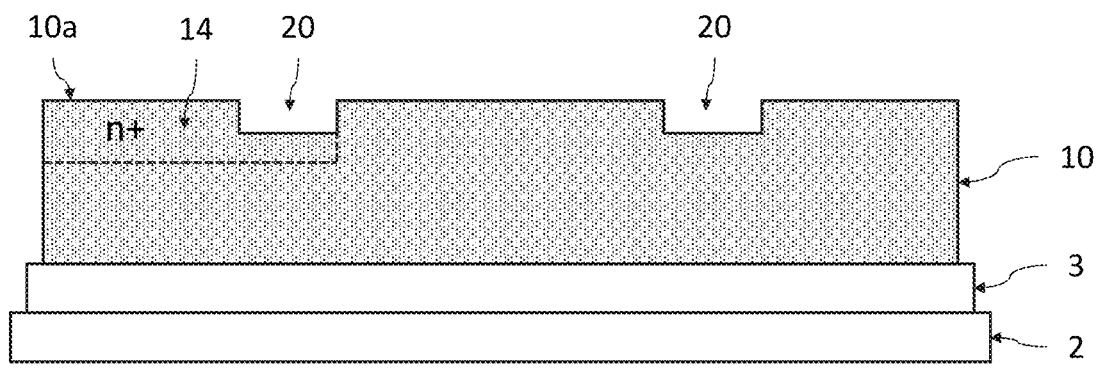

With reference to FIG. 3D, one of the doped regions of the pin junction is formed, here the n+ doped region 14. Here, the doping is achieved by localized ion implantation of dopant species of the n type, for example phosphorus. Here, the n+ doped region 14 has a depth of around 135 nm.

Figure 3E:
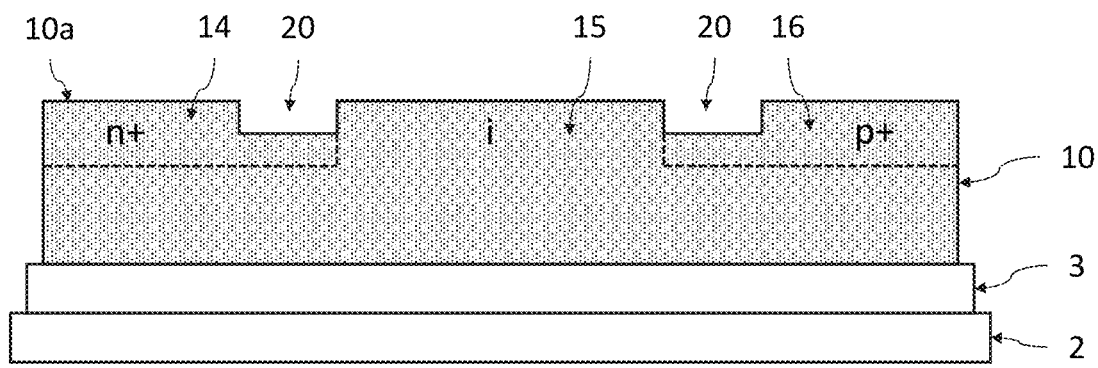

With reference to FIG. 3E, the other of the doped regions of the pin junction is formed, here the p+ doped region 16. The doping is carried out here by localized ion implantation of dopant species of the p type, for example boron. The n+ and p+ doped regions 14, 16 are spaced one from the other in the plane XY by the intrinsic region 15 (not intentionally doped). The p+ doped region 14 here also has a thickness of around 135 nm. A laser annealing may be carried out in order to activate the dopants of the n+ and p+ doped regions 14, 16.

Figure 3F:
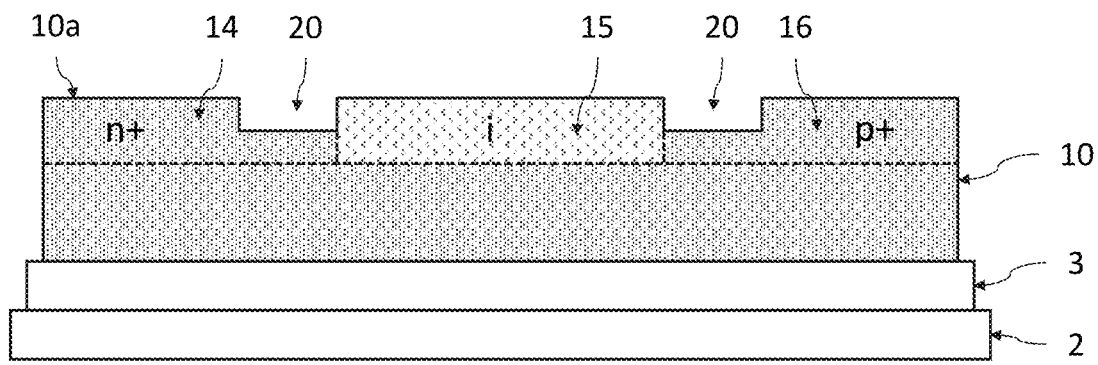

With reference to FIG. 3F, a localized amorphization of a part of the semiconductor layer 10, here in the intrinsic region 15, is carried out. This step is optional and may therefore be omitted. This localized amorphization is performed by ion implantation of non-dopant chemical elements, for example here germanium or silicon. The amorphization depth is preferably equal to at least the depth of the n+ and p+ doped regions 14, 16, and hence here to around 135 nm.

Figure 3G:
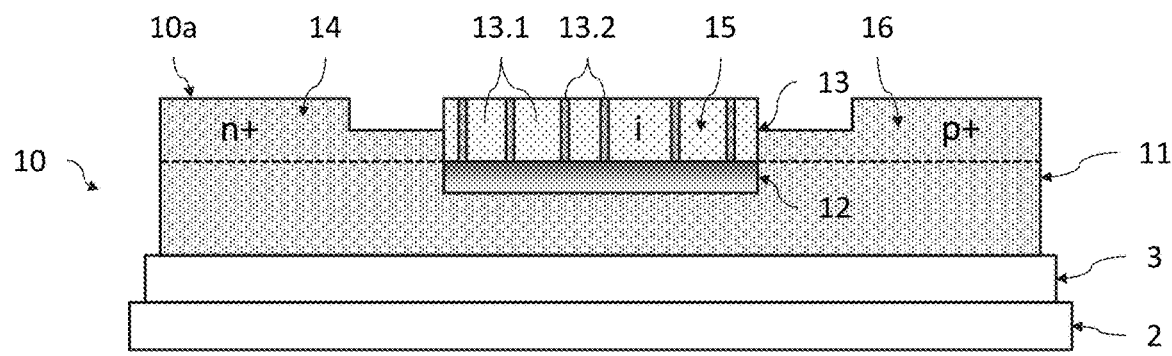

With reference to FIG. 3G, the intermediate portion 12 and the upper portion 13 are formed by localized NLA (for Nanosecond Laser Annealing) of a part of the semiconductor layer 10, and more precisely of the part rendered amorphous. For this purpose, the upper face of the amorphous part of the semiconductor layer 10 is subjected to a laser pulse having a wavelength, a minimum energy density and a minimum duration predefined in such a manner as to cause the total fusion of the amorphous part over its whole depth and over its whole width, together with the total fusion of a part of the underlying single-crystal GeSn. The laser pulse has a wavelength adapted so that the laser pulse is absorbed, at least in part, by the semiconductor layer 10, for example a wavelength in the ultra-violet, for example equal to 308 nm. It should be noted that the duration of a laser pulse is defined as the width at half-height of the time variation of the optical intensity.

Furthermore, "total fusion" is understood to mean that the GeSn is entirely molten, and that it does not remain locally in crystalline form. In this example, the fusion of the GeSn is carried out over a depth greater than 135 nm, for example over a depth equal to at least around 150 nm. By way of example, the laser pulse may last at least a few tens or hundreds of nanoseconds, for example equal to at least 145 ns (width at half-height of the laser pulse) and may have an energy density equal to at least a value which depends on the illuminated material (chemical composition, crystalline state, surface state and mechanical stresses, notably). Thus, in the case where it is desired to apply the laser pulse to the region 14 having been n+ doped and amorphized by ion implantation of phosphorus with a dose of $3 \times 10^{15}$ at/cm$^2$ with an energy equal to 50 keV or equal to 70 keV, the energy density of the laser pulse may be respectively equal to at least 0.7 J/cm$^2$ or to 0.8 J/cm$^2$ in order to obtain a total fusion of the GeSn over a depth of at least 150 nm. In the variant where the upper portion 13 has not been amorphized by ion implantation, the energy density of the laser pulse may be higher than 0.8 J/cm$^2$. These values may thus be adapted in order to obtain a total fusion of the portion of GeSn over the desired depth.

When the annealing by nanosecond laser has finished, a recrystallization of the GeSn takes place, with a crystallization front which moves from the non-molten single-crystal GeSn in direction of the upper face 10a. It then becomes apparent, surprisingly, that this leads to the formation of the intermediate portion 12 where the atomic proportion of tin drops to the minimum value $x_{pi1}$, here equal to around 2%, and in the formation of the upper portion 13 which is composed of the homogeneous medium 13.1 with an atomic proportion of tin $x_{ps1}$ here equal to around 7%, substantially homogeneous and greater than $x_{pi1}$, in which vertical structures 13.2 are situated with an atomic proportion of tin $x_{ps2}$ here equal to around 16%, greater than $x_{ps1}$. Moreover, it is apparent that the upper portion 13 is single-crystal despite the presence of the vertical structures 13.2, and that it exhibits a tensile stress with a value $\varepsilon_{ps}$ here equal to –0.4% around. Thus, in the upper portion 13, the tensile stress $\varepsilon_{ps}$ and the atomic proportion of tin $x_{ps1}$ are such that the energy band structure is direct in the homogeneous medium 13.1 and a fortiori in the vertical structures 13.2. In addition, the energy band structure in the upper portion 13 (and hence in the intrinsic region 15) shows that the vertical structures 13.2 form quantum wells adapted to the generation of infrared radiation. Lastly, as previously indicated, in the intermediate portion 12, the region depleted in tin where the atomic proportion of tin $x_{pi1}$ (here around 2%) is less than $x_{ps1}$ (here around 7%) forms a barrier region which extends under the whole upper portion 13 and tends to confine the charge carriers within the upper portion 13 and hence within the intrinsic region 15.

Figure 3H:
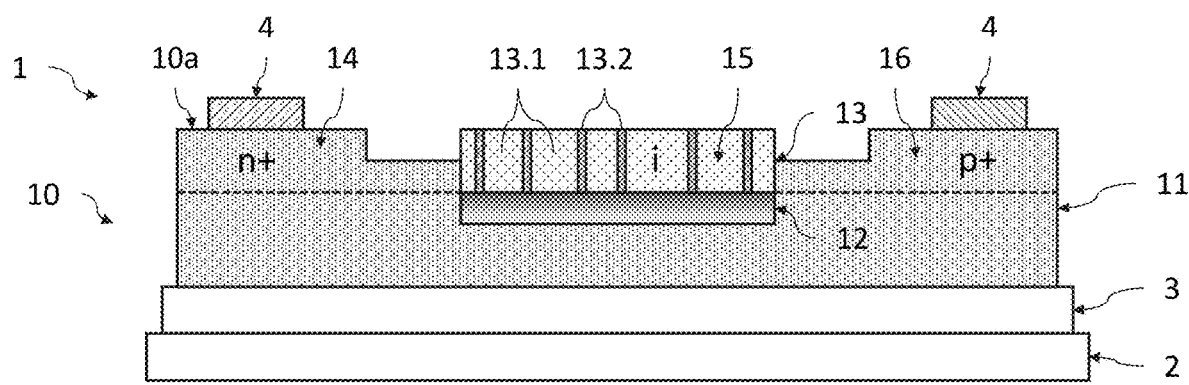

With reference to FIG. 3H, lastly, the metal contacts 4 are formed, which lie on the upper face of the semiconductor layer 10, one in contact with the n+ doped region 14 and the other in contact with the p+ doped region 16. These metal contacts are connected to an electrical source which allows the laser diode to be polarized.

Thus, the method allows an optoelectronic device 1, here a laser diode, to be fabricated, where the semiconductor layer 10 comprises a base portion 11, an intermediate portion 12 one region of which forms a barrier region, and an upper portion 13 where the intrinsic region 15 is situated and which comprises vertical structures 13.2 forming quantum wells. The upper portion 13 is single-crystal, under tensile stress and exhibits a direct band structure. An optoelectronic device 1 is therefore obtained with good performance characteristics for the emission or the detection of light. This semiconductor layer 10 comprising GeSn, with these intermediate 12 and upper 13 portions, is not therefore formed by techniques of engineering the mechanical stresses or by a technique using a suspended membrane put under tension and then collapsed, as in the examples of the aforementioned prior art.

It should be noted that the application of an annealing by nanosecond laser to a semiconductor layer 10 based on GeSn is described in the article by Gallucio et al. entitled *"Cell formation on stanogerinanides using pulsed laser thermal anneal on $Ge_{0.91}Sn_{0.09}$"*, Materials Science in Semiconductor Processing 121 (2021) 105399. However, in this article, the laser pulse illuminates a layer of nickel which covers the semiconductor layer 10 of GeSn, and rather than directly illuminating the latter. It has an energy density in the range between 100 and 500 mJ/cm$^2$. This layer of nickel absorbs the laser radiation and provides a thermal conversion causing the fusion of the underlying GeSn. If the formation of vertical columns rich in tin is observed, it is not described that the semiconductor layer 10 undergoes a sufficient tensile stress for the band structure to be direct, nor that an underlying intermediate portion depleted in tin has been formed.

According to another embodiment, the optional step for amorphization (FIG. 3F) of a part of the semiconductor layer 10 is omitted. Accordingly, after the steps for formation of the n+ and p+ doped regions 14, 16, the method can proceed directly to the step for annealing by nanosecond laser. This annealing may be localized and allow the overall structure depicted in FIG. 3G to be obtained. As a variant, it may be global, in the sense that it is applied to the whole of the upper face 10a of the semiconductor layer 10 and allows a structure similar to that in FIG. 4A to be obtained. The energy density of the laser pulse with a wavelength of 308 nm is then adapted, and may be higher than around 0.8 J/cm$^2$, with a duration of at least 145 ns, in order to obtain a complete fusion of the GeSn over a depth equal to at least around 150 nm.

Figure 4A:
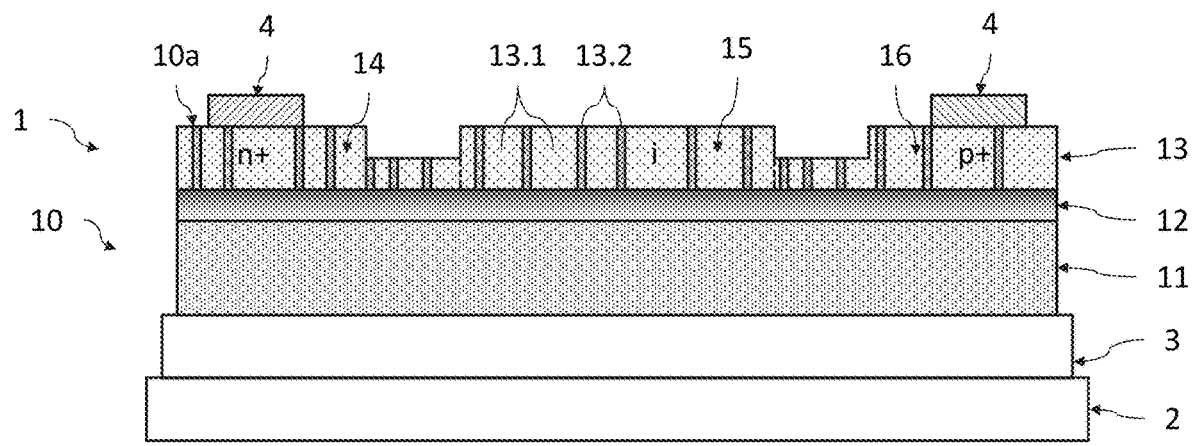
FIGS. 4A and 4B are schematic and partial views, as a transverse cross-section, of an optoelectronic device according to variant embodiments.

In this regard, FIG. 4A is a partial and schematic view, as a transverse cross-section, of an optoelectronic device 1 according to one variant embodiment. The optoelectronic device 1 here differs from that in FIG. 1A essentially in that the annealing by nanosecond laser has not been carried out in a localized manner, i.e. on a precise surface of the upper face 10a, but it has been applied to the whole upper face 10a (the vertical structures 13.2 are therefore also present within the doped regions 14, 16). Thus, the intermediate portion 12 extends over the whole width of the semiconductor layer 10, and vertically separates the base portion 11 from the upper portion 13. The n+ and p+ doped regions 14, 16 are therefore situated within the upper portion 13 and no longer within the base portion 11. The barrier region (depleted in tin) of the intermediate portion 12 therefore extends under the n+ doped region 14, the intrinsic region 15 and the p+ doped region 16. The optoelectronic device 1 according to this variant may be fabricated by a method similar to that described with reference to FIGS. 3A to 3H (and which are distinguished by the fact that the annealing by nanosecond laser has been applied to the entire upper face 10a), where the annealing by nanosecond laser may or may not be preceded by an amorphization step.

Figure 4B:
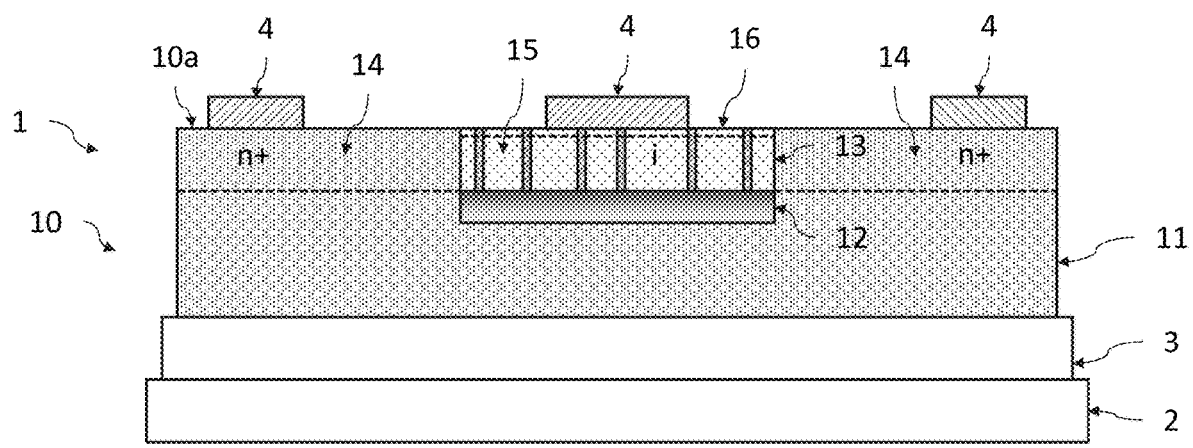

In this regard, FIG. 4B is a partial and schematic view, as a transverse cross-section, of an optoelectronic device 1 according to one variant embodiment. The optoelectronic device 1 here is a laser diode, which differs from that in FIG. 1A essentially in that one of the doped regions, here the p+ doped region 16, is situated within the upper portion 13, above the intrinsic region 15. In this example, the n+ doped region 14 is situated on either side, in the plane XY, of the intrinsic region 15 and of the p+ doped region 16. It is situated within the base portion 11 (configuration of FIG. 1A), but as a variant, it could be situated within the upper portion 13 (configuration of FIG. 4A). The p+ doped region 16 is formed from an upper region of the upper portion 13 which is flush with the upper face 10a. A metal contact 4 therefore lies on and in contact with the p+ doped region 16 of the upper portion 13. Further more, in this example, the semiconductor layer 10 does not necessarily comprise any recess bounding, in the plane XY, the upper portion 13 and, here, the intrinsic region 15 and the p+ doped region 16.

Particular embodiments have been described hereinabove. Other variants and modifications will become apparent to those skilled in the art.

The invention claimed is:

1. An optoelectronic device for emitting or for receiving an infrared radiation, comprising:
a nucleation layer;
a crystalline semiconductor layer comprising GeSn, extending in a main plane, having an upper face opposite to the nucleation layer, and comprising:
a base portion, extending over and in contact with the nucleation layer;
an upper portion, extending over the base portion, a single-crystal, and under a tensile stress with an average value Cps in the main plane of the crystalline semiconductor layer, composed of a homogeneous medium having a uniform value $x_{ps1}$ of an atomic proportion of tin of the homogeneous medium, the average value $\varepsilon_{ps}$ of the tensile stresses and the uniform value $x_{ps1}$ of the atomic proportion of tin being such that the upper portion has a direct bandgap structure;
a pin semiconductor junction, comprising a doped region of an n type and a doped region of a p type, flush with the upper face, and an intrinsic region situated within the upper portion and extending between the doped regions; and
metal polarizing contacts, situated on and in contact with the doped regions,
wherein the single-crystal of the upper portion comprises, aside from the homogeneous medium, vertical structures extending in the homogeneous medium along an axis orthogonal to the main plane over a whole thickness of the upper portion, and having an average value $x_{ps2}$ of the atomic proportion of tin greater than the uniform value $x_{ps1}$, thus forming regions for emitting or for receiving said infrared radiation, and
wherein the crystalline semiconductor layer furthermore comprises an intermediate portion, situated between and in contact with the base portion and the upper portion along an axis orthogonal to the main plane, the single-crystal of the upper portion, and a region extending in the main plane over its whole width and having an average value $x_{pi1}$ of the atomic proportion of tin less than the uniform value $x_{ps1}$, thus forming a barrier region against charge carriers flowing in the upper portion.

2. The optoelectronic device according to claim 1, wherein the base portion has an average value $x_{pb}$ greater than the average value $x_{pi1}$ of the atomic proportion of tin in the intermediate portion and less than the average value $x_{ps2}$ of the atomic proportion of tin in the vertical structures.

3. The optoelectronic device according to claim 2, wherein the average value $x_{pb}$ of the atomic proportion of tin in the base portion is in the range between 4% and 10%.

4. The optoelectronic device according to claim 1, wherein the base portion extends up to a surface of the upper face, and surrounds the intermediate portion and the upper portion in the main plane, at least one of the doped regions being situated within the base portion.

5. The optoelectronic device according to claim 1, wherein the intermediate portion entirely covers the base portion, the doped regions being situated within the upper portion.

6. The optoelectronic device according to claim 1, wherein the semiconductor layer is formed, starting from the nucleation layer, of a lower region and a single-crystal upper region which covers the lower region, the upper portion being situated within the upper region.

7. The optoelectronic device according to claim 1, wherein the nucleation layer is made of germanium and lies on a carrier substrate preferably comprising silicon.

8. The optoelectronic device according to claim 1, forming a laser diode or a light-emitting diode designed to generate infrared radiation, or a photodiode designed to detect infrared radiation.

9. The optoelectronic device according to claim 1, forming a laser diode, comprising a lower waveguide formed within the nucleation layer of germanium, an active waveguide coupled to the lower waveguide, comprising the gain medium and formed within the semiconductor layer, and at least one Bragg reflector situated within the lower waveguide or within the active waveguide.

* * * * *